Oct. 26, 1954 R. M. COHEN 2,692,919

STABILIZED DRIVEN GROUNDED GRID AMPLIFIER CIRCUITS

Filed June 11, 1951

Inventor
Robert M. Cohen

By H. L. Newton

Attorney

Patented Oct. 26, 1954 2,692,919

UNITED STATES PATENT OFFICE 2,692,919

STABILIZED DRIVEN GROUNDED GRID AMPLIFIER CIRCUITS

Robert M. Cohen, Belleville, N. J., assignor to Radio Corporation of America, a corporation of Delaware Application June 11, 1951, Serial No. 230,945

2 Claims. (Cl. 179—171)

This invention relates to amplifier circuits. More particularly, the present invention relates to neutralization of low-noise high-gain triode amplifiers used in radio frequency circuits or the like requiring tuning over a broad band of frequencies.

With the advent of television and the use of the ultra-high frequency and very-high frequency spectrum and the inherently greater noise of the broad band systems utilized, it has become necessary to provide low-noise high-gain receiving systems. It is generally recognized that the sensitivity of a receiving system is primarily limited by the characteristics of the radio frequency amplifier tubes utilized. More precisely, the sensitivity of the system is limited by the signal-to-noise ratio obtainable with the specific tubes used in the system.

In tuned radio-frequency amplifier circuits, pentode amplifier tubes are preferred over triode amplifier tubes because of their stability and gain. However, due to the inherently greater noise characteristic of a pentode amplifier, a poorer signal-to-noise ratio results. Therefore, at frequencies of operation where tube noise becomes an important factor, such as in television receivers, it is preferable to have an amplifier with the gain and stability of a pentode amplifier, and with the signal-to-noise ratio of a triode amplifier.

The above requirements for an optimum design have been generally recognized in the past but it has been believed that stability difficulties and other problems associated with the use of triode tubes in conventional circuits limited their extensive application in television tuners. Consequently, pentodes have in the past been used in radio frequency amplifiers for most receiving systems, despite their higher noise.

An improved triode grounded-grid amplifier circuit is described in the Alexanderson Patent 1,896,534 in a circuit which does not require neutralization. However as with most conventional triode grounded-grid amplifiers it has a very low input impedance which varies inversely as the transconductance, making it difficult to maintain correct input impedance matching, if a gain control grid bias potential is used in the input radio-frequency amplifier stage. For this reason even this triode circuit is unstable in operation as a radio frequency amplifier. It is therefore noted that grounded grid operation alone is not satisfactory for television radio frequency input amplifier use when it is necessary to provide gain control in the radio frequency amplifier stage to avoid overloading of the intermediate frequency amplifier stages when strong signals are present.

Another type of circuit arrangement for triode tubes is the grounded-cathode driver stage followed by a grounded-grid driven stage, disclosed by Romander in "QST" September 1933. This circuit provides the advantages of both pentode and triode operation in high gain with very good signal-to-noise operation. However, the grounded cathode input circuit has the serious disadvantage of requiring a rather critical neutralizing circuit and is often unstable when a tuned input circuit is utilized. Neutralization was provided for this type of circuit as used in a transmitter disclosed by C. E. Strong in "Electronics" July 1940 in an article entitled "The Inverted Amplifier." This neutralization system is also disclosed in United States patent to C. E. Strong No. 2,241,892, issued May 13, 1941.

A combination grounded-cathode grounded-grid intermediate frequency amplifier of the same type is also disclosed in an article in "Proceedings of the I. R. E.," June 1948, pages 700 to 708 entitled "A Low-Noise Amplifier" by H. Walman et al. This circuit arrangement combines the desirable features of pentode and triode operation. It has the low output-to-input admittance of pentodes and the low noise features of triodes. However, in order to obtain optimum results with this circuit, critical neutralization of the input stage is again required.

Therefore it is an object of the present invention, to provide an improved high-gain low-noise triode amplifier system operable in radio frequency amplifier circuits with the application of automatic gain control potentials, without requiring critical neutralization adjustment and providing stable operation over a wide range of frequencies.

In addition to the requirement for low-noise and high-gain operation, an amplifier having optimum operating characteristics should provide a number of operating characteristics as will be enumerated hereinafter. As before mentioned, proper antenna operation is desired and may be obtained when the input impedance of the radio frequency amplifier does not change with the application of gain control bias voltage to the radio frequency amplifier. In conventional amplifier circuits of the driven grounded-grid type which are desirable for low-noise operation at high frequencies, the proper antenna operation is effected by neutralization circuits.

The prior art has thus provided the above mentioned resonant neutralization circuits and such conventional neutralizing circuits as a parallel inductor for tuning out plate-to-grid triode capacity causing the feedback, and resulting in improper antenna operation, as shown in the Nichols Patent 1,325,879. Such circuits embodying tuned circuits are in general only effective at a single tuned frequency. Thus when the use of grounded-grid amplifiers in a tuned radio-frequency amplifier circuit is desired, the neutralizing circuit must be tuned with other circuits to be effective over broad tuning bands, thereby requiring more circuit elements and critical adjustments.

It is desirable therefore to have a system providing effective neutralization independent of the tuning frequency. Negligible signal cross modulation by the radio-frequency amplifier tube is desired, and is in fact essential in television R. F. amplifier circuits, where good signal-to-noise ratios are also desirable. Cross modulation results from non-linear portions of the characteristic tube response curves, such as obtained where sharp cut-off tubes are used. Accordingly a remote cut-off characteristic is desired for better signal-to-noise response. Triode amplifier tubes are not inherently capable of remote cut-off characteristics, and therefore pentode tubes have for this reason also been preferred in the past. Therein the cut-off characteristic is extended by a variable pitch control grid winding or a high resistance screen grid resistor. These methods both induce inherently high noise into the amplifier and are therefore not preferred.

It has been found in accordance with the invention, however, that with the operation of two sharp cut-off triodes in tandem with series-connected direct-current discharge paths, a low-noise remote cut-off characteristic may be obtained. The conventional methods of obtaining a remote cut-off characteristic are undesirable from the further viewpoint of input loading. A sharp cut-off characteristic is preferred to provide a lower input loading characteristic and a resulting higher gain.

A further object of the invention therefore, is to provide extended cut-off characteristics in triode amplifiers without impairing the input loading impedance characteristics, thereby providing negligible signal cross modulation in a triode radio-frequency amplifier circuit.

It is further desirable to maintain oscillator radiation within acceptable limits in a radio-frequency amplifier circuit. The radiation is a function of the admittance of the circuit looking from the output terminals back to the input terminals. Accordingly it is another object of the invention to provide decreased oscillator radiation by decreasing the output admittance of the radio-frequency amplifier circuit.

It is another object of this invention to provide a simplified, highly efficient low-noise high frequency signal amplifier circuit.

It is a further object of this invention, to provide an efficient driven grounded-grid amplifier circuit which is relatively free from cross modulation and oscillator radiation.

It is still a further object of this invention, to provide an efficient driven grounded-grid amplifier circuit having extended grid cut-off characteristics, without the use of tubes employing variable grid winding pitch thereby providing a better signal-to-noise characteristic.

In accordance with this invention, therefore there is provided an amplifier circuit comprising a grounded-cathode triode driver stage coupled by an untuned or broadly tuned circuit to the cathode electrode of a grounded-grid triode driven stage. There is further provided means for neutralizing the anode-grid capacitance of the driver stage comprising an untuned feedback circuit connected between a portion of the output circuit of the driven stage and the grid of the driver stage.

Further objects and features of the invention will be covered by the ensuing discussion of certain embodiments and an understanding of the mode of operation of the invention will be made clear when considered in connection with the accompanying drawing in which.

Figures 1, 2, 3:
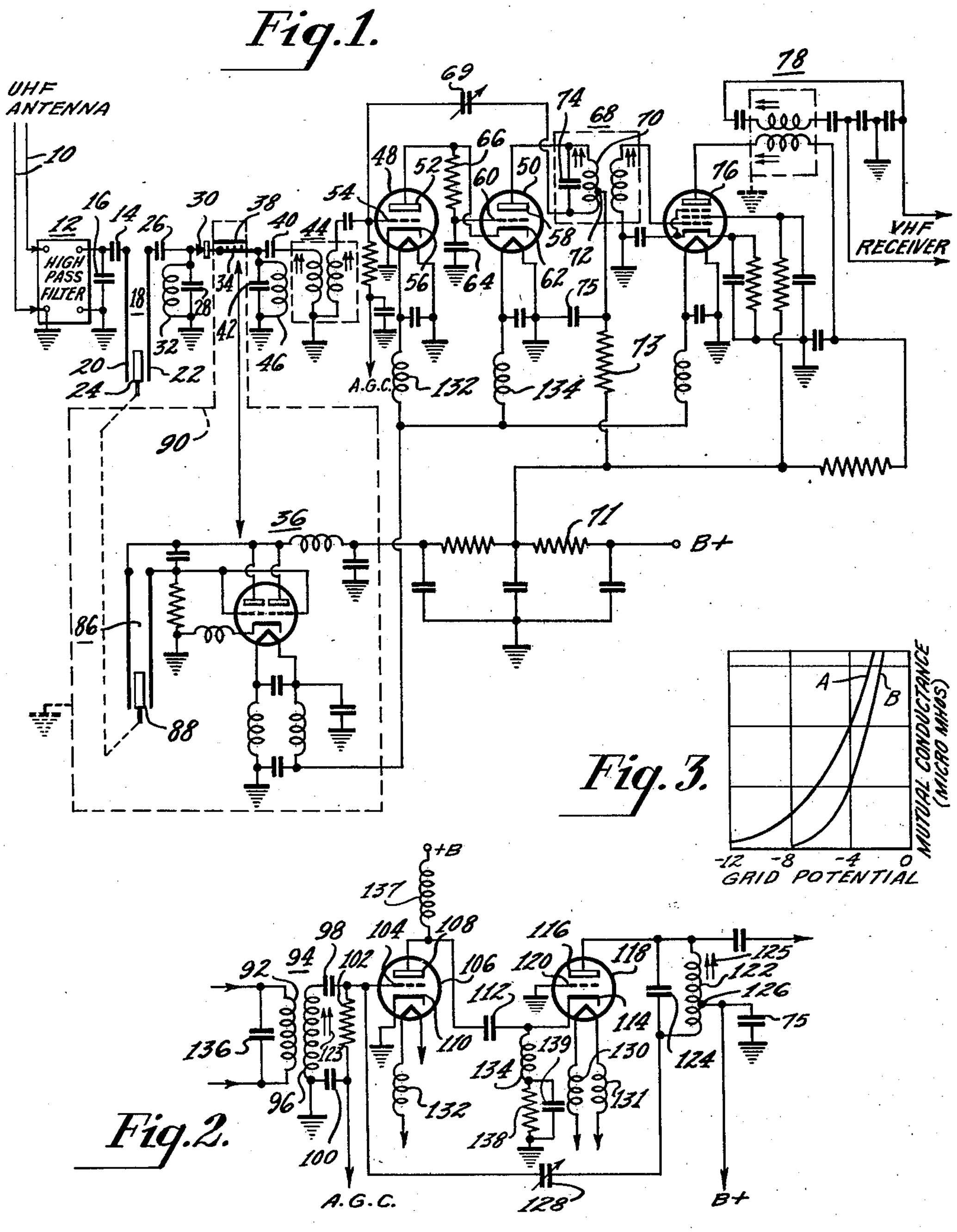
Figure 1 is a schematic circuit diagram of an ultra-high frequency television converter circuit embodying the amplifier circuit of the invention in an intermediate frequency stage.
Figure 2 is a schematic circuit diagram of a tunable radio-frequency amplifier circuit embodying a further embodiment of the amplifier circuit of the invention; and, Figure 3 is a graph showing characteristic curves of operation in accordance with one embodiment of the invention.

Referring now to Figure 1, an ultra-high-frequency television tuning adapter unit is shown, wherein a transmission line 10 may be connected at one end to an ultra-high-frequency (UHF) antenna and connected at the other end to a high-pass filter network 12. The output signal from the high-pass filter circuit is thereby attenuated at frequencies below 480 megacycles and all signals in the very-high-frequency range (below 480 megacycles) are rejected, thus enabling the reception of signals having frequencies in the ultra-high-frequency range (above 480 megacycles).

The capacitors 14 and 16 provide an impedance transformation network to establish proper impedance matching between the high-pass filter circuit 12 and a resonant tuning circuit 18. The resonant circuit 18 comprises a pair of tunable inductors 20 and 22 and a movable core 24. This circuit is tunable over the desired frequency range and may be of any form as well known in the art but the type of circuit as more fully described and claimed in a copending application by T. Murakami, Ser. No. 142,012, filed February 2, 1950, entitled "Ultra High Frequency Tuning Systems," and assigned to the assignee of the present application is preferred.

There is coupled to the output inductor 22 of the tunable circuit 18 a pair of serially connected capacitors 26 and 28. These capacitors, like the capacitors 14 and 16, provide impedance transformation. Therefore the tunable circuit 18 is properly matched to a succeeding crystal diode mixer 30. A choke coil 32 is connected in shunt with the capacitor 28 to establish a direct-current path for the crystal mixer 30.

There is connected to one electrode, which may be the anode, of the crystal mixer 30 a conductor 34 which serves as the oscillator wave pick-up device, or coupling circuit, between the crystal mixer 30 and an associated oscillator circuit 36, which may be of a conventional type well known in the art. An oscillation injection equalizer 38 partially surrounds the conductor 34 to provide substantially constant oscillator wave energy injection over the entire frequency spectrum used here. The characteristic and operation of the injection equalizer 38 is more fully described and claimed in a copending application by Wen Yuan Pan, Ser. No. 190,786, filed October 18, 1950, entitled "Ultra High Frequency Oscillation Injection Equalizer," and assigned to the assignee of the present application. The frequency of the local oscillator 36 is adjusted to a frequency below the ultra-high-frequency carrier wave by an amount equal to the desired intermediate-frequency, which in this case may be centered at 43 megacycles or at some other desirable frequency.

The other end of conductor 34 is connected to a pair of impedance transformation capacitors 40 and 42 which are provided to properly match the crystal mixer circuit with an intermediate-frequency transformer 44. There is also provided a choke coil 46 which is connected in shunt with the capacitor 42 to complete the direct-current path of the crystal mixer 30. Mixing of the oscillator and input wave energies is accomplished due to the nonlinearity of the crystal mixer 30. As is well known in the art a non-linear device when subjected to different frequencies will produce in its output circuit the sum and difference frequencies of the two impressed waves. In this instance the tuned circuit in the output of the crystal mixer 30 is tuned to 43 megacycles which is the difference frequency of the two impressed waves.

The intermediate-frequency transformer 44 provides coupling between the mixer circuit and the driven-grounded-grid intermediate-frequency stage constructed in accordance with the invention and comprising a pair of triode electron tubes 48 and 50. The tube 48 is connected in circuit as a grounded-cathode driver stage for the grounded-grid driven amplifier stage including tube 50. It is noted that these two electron tubes are connected with both their signal circuits and their direct-current discharge path circuit in series. The grounded-cathode driver tube 48 and the grounded-grid driven amplifier 50 combine to provide a low-noise amplifier stage in accordance with the invention, which is used in this embodiment of the invention as an intermediate-frequency fixed-tuned amplifier. It is to be recognized however, that certain features of the invention provide improved operation as a variable frequency amplifier, as will hereinafter be shown in connection with Figure 2.

The grounded-cathode driver tube 48 comprises an anode 52, a control grid 54 and a cathode 56. The cathode of this stage is directly connected to a point of fixed reference potential such as ground, and an automatic gain control bias potential is provided for the grid 54, thereby necessitating the aforementioned precautions necessary to prevent mistuning.

The grounded-grid driven stage includes tube 50 having an anode 58, a control grid 60 and a cathode 62. The cathode 62 of electron tube 50 is directly connected for both signal currents and energizing direct current to the anode 52 of electron tube 48. In order to establish the control grid 60 of the driven tube 50 at signal ground potential, a signal frequency bypass capacitor 64 is connected between the grid 60 and ground. There is also provided a grid leak resistor 66 which is connected between the control grid 60 and the cathode 62 of the electron tube 50 in order to establish grid leak bias. The grid leak resistor 66 must be of a high resistance for this purpose to prevent the flow of excessive grid current. A suitable value for the grid leak resistor is of the order of 0.5 megohm.

This direct-coupled circuit, that is the direct connection between the anode 52 and the cathode 62, reduced the usual rate of change of transconductance with bias, as shown in curve B of Figure 3 to the more desirable characteristic of curve A. From the curve data the rate of change in the slope of the curve in the −4 to −12 volt region should be considered. Small differences in this characteristic make large differences in cross-modulation products, as reference to any of the known prior art analyses of cross modulation due to non-linear response of amplifiers will indicate. The advantage of the more linear characteristic of curve A is considered important because of the decreased tendency for noise signals due to cross modulation.

The curve B at the right is that illustrative of the characteristic for a single triode unit and is applicable for the capacitively coupled amplifier circuit of the invention shown in Figure 2. The curve A at the left is applicable for the series connected circuit shown in Figure 1, and provides such operational characteristics in connection with the twin-triode amplifier circuit that remote cut-off is consistent with lower input loading.

Also, perhaps it would be well to reiterate, for the sake of clarity that the conventional methods of obtaining remote cut-off characteristics, by using variable-pitch winding on the control grid must of necessity impair noise-free performance to a serious degree. A tube having a variable pitch grid provides a poor signal-to-noise ratio for high frequency input loading as compared to the same tube having a linear pitch grid. The increase in loading of variable-pitch grids, which causes a serious degradation of signal-noise ratios is well known among tube designers. For this reason, remote cut-off tubes have not heretofore been preferable in the high frequency amplifiers circuits of receivers. They are useful, of course, at lower frequencies where input loading is not a limiting factor, i. e., the 6SK7 is generally well adapted for use in broadcast receiver radio-frequency stages.

The anode 58 of the driven electron tube 50 is connected to the high potential input terminal of an intermediate-frequency transformer 68. The lower potential terminal of the transformer primary winding 70 is capacitively connected by means of a neutralizing capacitor 69 to the control grid 54 of the grounded-cathode driver tube 48 to provide a neutralizing voltage, as will be more fully explained in connection with Figure 2 of the drawing. It is noted at this time that the positive terminal of the source of direct-current energizing potential is connected from B+ through series resistors 71 and 73 to the primary winding 70 at an intermediate tap 72. The tap 72 is maintained at signal ground potential by capacitor 75. The B+ and signal ground connection is made in this manner in order to improve compensating voltage feedback of proper phase and magnitude for neutralizing the capacitive feedback across the inherent interelectrode capacitance between the anode 52 and the control grid 54 of the driver tube 48. There is also provided a capacitor 74 which is connected across the terminals of the primary winding 70 to establish a greater degree of coupling between the two transformer sections, above and below the tap 72, as will hereinafter be more fully described.

The output circuit of the intermediate-frequency transformer 68 is connected to a second intermediate-frequency amplifier stage including tube 76 to provide further amplification of the intermediate-frequency signal wave. The output signals of this second intermediate-frequency amplifier tube 76 may be connected by means of a tunable intermediate-frequency transformer 78 and a switching circuit (not shown) to the input of a conventional very-high-frequency (V-H-F) television receiving system. The oscillator circuit 36, which is designed to operate at a frequency below the received ultra-high-frequency carrier wave by an amount equal to the desired intermediate-frequency, is tuned by means of a tunable circuit 86 which is also preferably constructed in accordance with the teachings of T. Murakami, as disclosed in the above-mentioned copending application. The tunable circuit 86 is provided with a movable core 88 which is mechanically coupled with the movable core 24 of the tunable circuit 18 to provide unicontrol tuning of the system throughout the desired frequency spectrum.

Excessive oscillator radiation in this converter unit is prevented by means of a grounded metal shield 90 which surrounds the oscillator circuit as well as the injection equalizer 38 and the coupling inductor 34 of the crystal mixer circuit 30. Oscillation energy radiated by the oscillator 36 is thus confined within the shield and is externally impressed solely by means of the coupling circuit comprising the conductor 34 and the oscillator injection equalizer 38.

Referring now to Figure 2 there is provided an amplifier circuit designed for improved operation as a radio-frequency amplification stage. In this embodiment of the invention it will be noted that the anode 108 of the driver triode 106 is coupled to the cathode 114 of the driven triode 118 through capacitor 112, whereas Figure 1 shows the use of a direct coupled arrangement. The capacitance-coupled arrangement has the advantage of requiring less total supply potential because the tubes are essentially in parallel with regard to direct-current supply potential. In the direct-coupled arrangement of Figure 1, as noted previously, the tubes are connected in series across the source of potential. Thus the circuit of Figure 2 requires only half the supply potential of that shown in Figure 1.

The circuit of Figure 2, however, has the disadvantage, as compared with the invention shown in Figure 1, of requiring more circuit elements (112, 134 and 137) as well as the loss of benefits of extended cut-off derived from the series connection. The input circuit, which is designated as the primary winding 92 of a radio-frequency transformer 94 may be connected to an antenna circuit (not shown) or to a high-pass filter circuit such as the high-pass filter circuit 12 shown in Figure 1 of the drawing. For tuning of such circuits in television receivers the transformer is generally entirely replaced by a new tuned circuit by means of a turret tuning mechanism. Such means are not shown. On terminal of the secondary winding 96 of the radio-frequency transformer 94 is connected by means of a capacitor 98 to the control grid 104 of the driver tube 106. Automatic gain control potentials may be provided by means of a conventional circuit (not shown) and may be coupled to the control grid 104 of the driver tube 106 by means of the grid resistor 102 which is connected between the control grid 104 and a decoupling capacitor 100 which may be part of the automatic gain control filter network.

The electron tube 106 comprises an anode 108 and a cathode 110, which is connected to ground. This tube functions in the manner similar to that described in connection with electron tube 48 of Figure 1. The anode 108 is, however, connected by means of capacitor 112 to the cathode 114 of the driven tube 118. The required plate potential for the driving tube 106 is applied therefore through choke 137, which has sufficient self inductance to present a high impedance to signal frequencies. The driven tube 118 functions in a similar manner as that discussed above in connection with electron tube 50 illustrated in Figure 1 and comprises an anode 116, a grounded control grid 120 and a cathode 114.

The anode 116 is connected to one terminal of a resonant circuit comprising an inductor 122 and a shunt capacitor 124. The shunt capacitor 124 is found to provide better operation, in view of the tap 126 appearing at signal ground, thereby causing the entire inductance 122 to participate in determining the resonant frequency of the circuit. Normally at the high frequencies desired an inductor used as a circuit component has sufficient distributed capacitance effectively in shunt with it to be tuned without a lumped capacitor. This capacitor is preferably made as small as consistent with good neutralization to give as high an L/C ratio as possible for the higher frequency operation. It is to be understood that inductors 96 and 122 may be tunable by means of the movable cores 123 and 125 so as to enable adjustment of these resonant circuits to the desired radio frequency. This may either be a continuously tunable circuit or a peaking adjustment. As before mentioned for television receiver operation the entire tuned circuit is generally replaced for each channel. The particular tuning circuit used does not constitute a part of the present invention and any desired tuning arrangement may be used.

Direct-current energizing potentials for this amplifier circuit are provided by a source of power which is not shown but which is connected between the B+ terminal and ground. The tap 126 provided at a proper intermediate point on the inductor 122 and connected to signal ground by capacitor 75 is connected to B+. With reference to the tap 126 there will be developed across the lower portion of the inductor 122 a radio-frequency potential of such a magnitude and phase that when applied by means of a neutralizing capacitor 128 to the control grid 104 of the driver tube 106 it will oppose and cancel out the effect of the feedback through the interelectrode capacitance existing between the anode 108 and the control grid 104 of that tube. In order to complete the direct-current path of the electron tube 118 the cathode 114 is connected to direct-current ground by means of a choke coil 134 with the series bypassed resistor 138 being used to provide the usual cathode bias.

A pair of radio-frequency chokes 130 and 131 are connected one in each of the heater leads of tube 118 to effectively place the heaters at radio-frequency cathode potential. This prevents variations in heater-cathode capacitance from affecting the voltage applied to the cathode 114 of tube 118.

Extreme care must be taken to ground the grid with the shortest practical lead, because a long lead has enough impedance to raise the grid above signal ground. For accomplishing this, wafer sockets of a special design having the contact lug emerging from the edge of the sockets between the wafers are recommended.

In regard to the neutralized driven grounded-grid circuit having conventional capacitance coupling between the two tube units, as illustrated in Figure 2 of the drawing, optimum performance for a television tuner is obtained when the input circuit is double-tuned as illustrated by the arrangement of the shunt capacitor 136 connected across the primary winding 92, matched to the 300 ohm antenna, and the secondary winding 96 operating at the highest impedance obtainable without reducing the bandwidth response to less than 6 megacycles. The input transformer 94 should be tightly coupled and some attempt should be made to reduce the capacitive coupling such as by winding the secondary in a figure-eight configuration or by using electrostatic shielding. One convenient way of obtaining such shielding is by placing some ceramic material having a high dielectric constant between the inductors and grounding the edge of the ceramic shield so as to effectively shortcircuit to ground the capacitance from the shield to each coil. Care must be taken in wiring the grounded-grid driven unit to place the leads so that the anode-to-ground capacitance is not unduly increased. Otherwise the grounded-grid stage may oscillate. The anode 108 of the driver stage is maintained at radio-frequency cathode potential of the output unit 118 and the anode leads should be so placed that coupling to the output tube anode circuit is avoided.

The small capacitor 124 placed in shunt with the output inductor of the driven tube 118 in addition to its aforementioned function couples one side of the output inductor 122 to the other, in order to avoid any parasitic effect which might be experienced when this capacitor is not used. Such an effect might be caused if the portion of the inductor between the tap 126 and the lower end of the inductor 122 forms a series resonant circuit with the neutralizing capacitor 128. In this case, the resonant frequency of the output circuit is determined by the other section of inductor 122 without the shunt capacitor 124 and mistuning would result in addition to the improper resulting neutralization.

Because the neutralization circuit is located at a low potential point in the output circuit, the oscillator frequency component at that point will be small and the resulting output to input admittance for the oscillator frequency will be small enough to afford a very small oscillator radiation characteristic. In addition the grounded grid 120 prevents oscillator signals from directly feeding back through tube elements so that for all practical purposes the oscillator radiation is eliminated. The adjustment of the neutralizing capacitor 128 is not critical when the shunt capacitor 124 is used and accordingly a driven grounded grid amplifier circuit may be used successfully in wide band radio-frequency amplifier circuit with variably tuned circuits.

Operation of such an amplifier circuit without neutralization tends to produce serious degeneration at the higher frequency bands. However, operation at the lower frequency bands is only slightly impaired. This difference in operation at the two extreme frequencies of the band makes possible what appears to be a most practical way of operating driven grounded-grid circuits in very-high-frequency tuner apparatus when selector switches are used as a tuning device as explained hereinafter. Taking advantage of this, for lower frequency operation the filament chokes 130 and 131 are adjusted to be approximately in resonance with the output capacitance of the first driver tube 106 plus the distributed capacitance of components and wiring from plate 108, cathode 114 to ground.

Since the amount of signal loss of the circuit is a function of the magnitude of the capacitance from the anode of tube 106 to ground, tuning out this capacitance with the filament chokes will eliminate the consequent need for neutralization as conventionally defined, although the tuning out of the capacitive reactance in the plate circuit, accomplished by the filament chokes may be considered as an unconventional form of neutralization. The resonant frequency of the filament choke circuit should be slightly above the highest signal frequency in order to avoid regeneration which would occur if the inductive reactance predominated. The tuned circuit is effective over the high frequency band since it is damped by the input impedance of the grounded-grid unit which is low and which does not vary with the application of automatic gain control potentials since AGC voltage is only applied to the input unit.

When the circuit is operated at low frequencies effectively with the resonant filament choke arrangement, instead of the capacitance feedback method, the noise factor in the worst case is increased by only two decibels which is on television channel 6, the highest frequency channel in the lower television band. The noise factor is only slightly reduced on the higher channels due to the beneficial effect of the filament chokes in preventing cathode to filament capacity variations. Because this circuit uses capacitance coupling between the units the effect of cross modulation may be more troublesome than with the circuit of Figure 1, but it is comparable to that experienced with the sharp cut-off type of pentodes now used.

On the other hand, the direct-coupled driven grounded-grid circuit, as illustrated in Figure 1, with its inherent reduction of distributed wiring capacitance results in a higher gain when the tuned filament choke arrangement is employed and in addition results in economies due to the elimination of circuit components. Antenna termination and cross modulation is improved considerably over the results obtained in the capacitively coupled circuits.

With reference again to Figure 1, it is well known by those skilled in the art that the voltage at the anode 58 of the driven tube 50 is not properly phased for neutralization and it is, therefore, necessary to employ a polarity reverser such as the tapped output inductor 70, or the inductor 122 as shown in Figure 2. It is important to note that the inductor 70 is not center tapped as is the case in conventional output circuits employed in neutralizing class B or class C radio frequency transmitter amplifiers but is tapped closer to the neutralizing signal takeoff point in the circuit.

For optimum gain and signal-to-noise ratio it can be shown that the ratio of the number of turns contained between the anode end of the inductor 70 and the tap 72 to the number of turns contained between the lower end of the inductor 70 and the tap 72 should be numerically equal to the gain of the driven tube 50. This is effectively the entire voltage gain of the stage as the driver tube operates with near unity gain. The value of the neutralizing capacitor 69 then should be approximately equal to the grid-to-anode capacitance of the driver tube 48. Other combinations of turns ratios and capacitors could be used if desired. Neutralization adjustment is provided by changing the value of the neutralizing capacitor, 69 of Figure 1 and 128 of Figure 2, and will be constant for any range of operating frequencies when the value of the neutralizing capacitor is equal to the grid-to-anode capacitance of the driver tube and providing the "Q" of the output circuit remains constant when tuned over the frequency range.

It has thus been shown that there is provided by the invention an improved driven grounded-grid amplifier circuit having a higher signal-to-noise ratio, good input impedance characteristics, less cross modulation, and favorable oscillator radiation. The amplifier thus provides improved operation because of the untuned neutralization circuit provided in this type of circuit in accordance with the present invention. Neutralization is therefore effected over a wide range of frequencies without critical adjustments. The amplifier may be utilized as a variably tuned input ultra-high-frequency amplifier circuit or as an efficient intermediate-frequency amplifier without the necessity of tuning the neutralization circuit.

What is claimed is:

1. A high-frequency wave amplifier circuit comprising in combination, a grounded-cathode driver stage including a grid-cathode input circuit and an anode circuit, a driven grounded-grid stage having an output circuit and a cathode, said cathode being directly connected to said anode circuit of said driver stage, said output circuit including an inductor having a relatively high potential radio-frequency terminal and a relatively low potential radio-frequency terminal; an intermediate tap on said inductor and circuit means connected therewith for maintaining said tap at signal ground potential and applying direct-current energizing potential to said circuit, and a capacitive neutralizing element connected between said relatively low-potential terminal and the grid side of said grid-cathode input circuit.

2. An ultra-high-frequency wave amplifier comprising, in combination, a driving electron tube having a cathode, a control grid and an anode, said cathode being connected to a point of fixed reference potential, an input circuit connected between said control grid and said point of fixed reference potential, a driven electron tube with a predetermined transconductance having a cathode, a control grid and an anode, said cathode of said second electron tube being directly connected to said anode of said first electron tube, said control grid of said second electron tube having a low signal impedance connection to said point of fixed reference potential, an output circuit with a pair of terminals comprising the parallel arrangement of a tunable inductor and a capacitor, the first of said pair of terminals being connected to said anode of said driven electron tube, a capacitive element connected between said grid of said driving electron tube and the second of said pair of terminals, and a signal reference tap on said inductor so disposed that the ratio of the inductance between said first of said pair of terminals and said tap to the inductance between the second of said pair of terminals is substantially equal to the reciprocal of said transconductance of said driven tubes.

References Cited in the file of this patent

UNITED STATES PATENTS

| Number | Name | Date |
|---|---|---|
| 2,241,892 | Strong | May 13, 1941 |
| 2,438,960 | Blitz | Apr. 6, 1948 |
| 2,581,953 | Hecht et al. | Jan. 8, 1952 |

FOREIGN PATENTS

| Number | Country | Date |
|---|---|---|
| 559,078 | Great Britain | Feb. 3, 1944 |

OTHER REFERENCES

"Radio Engineering," Terman, 3d ed., pp. 367-369, 373-374, 322-324; published by McGraw-Hill Book Co., N. Y. (Copy in Div. 69.)